United States Patent
Macomber

[11] Patent Number: 5,867,521
[45] Date of Patent: Feb. 2, 1999

[54] CURVED GRATING SURFACE-EMITTING DISTRIBUTED FEEDBACK LASER

[75] Inventor: Steven H. Macomber, Newtown, Conn.

[73] Assignee: Raytheon Company, Lexington, Mass.

[21] Appl. No.: 805,412

[22] Filed: Feb. 26, 1997

Related U.S. Application Data

[63] Continuation of Ser. No. 644,672, May 7, 1996, abandoned, which is a continuation of Ser. No. 229,493, Apr. 19, 1994, abandoned, which is a continuation-in-part of Ser. No. 974,775, Nov. 12, 1992, Pat. No. 5,345,466, which is a continuation-in-part of Ser. No. 975,303, Nov. 12, 1992, Pat. No. 5,307,183.

[51] Int. Cl.$^6$ ....................................................... H01S 3/19
[52] U.S. Cl. ............................................. 372/96; 372/102
[58] Field of Search ............................... 372/96, 102, 43, 372/50, 99; 257/88, 98

[56] References Cited

U.S. PATENT DOCUMENTS

| | | | |
|---|---|---|---|
| 4,803,696 | 2/1989 | Pepper et al. | 372/95 |
| 4,826,270 | 5/1989 | Opheij et al. | 369/100 |
| 5,105,403 | 4/1992 | Kando et al. | 369/44.12 |
| 5,307,183 | 4/1994 | Macomber | 359/11 |
| 5,345,466 | 9/1994 | Macomber | 372/96 |
| 5,392,308 | 2/1995 | Welch et al. | 372/92 |
| 5,539,571 | 7/1996 | Welch et al. | 359/344 |

FOREIGN PATENT DOCUMENTS

| | | |
|---|---|---|
| A-0 552 028 | 7/1993 | European Pat. Off. . |

OTHER PUBLICATIONS

IEEE Journal of Quantum Electronics, vol. 30, No. 1, Jan. 1994, New York, pp. 31–36, R. J. Lang, "Design of aberration–corrected curved–mirror and curved grating unstable resonator diode lasers".

Proceedings of the Society Of Photo–Optical Instrumentation Engineers (SPIE), vol. 239, 1980, Bellingham, US, pp. 10–18, A. Suzuki, K. Tada, "Theory and experiment on distributed feedback lasers with chirped gratings". (No month available)

Optics Letters, vol. 1, No. 2, Aug. 1997, Washington, US pp. 64–66, P. K. Tien, "Method of forming novel curved–line gratings and their use as reflectors and resoonators in integrated optics".

Agrawal and Dutta, Semiconductor Lasers, Van Nostrand Reinhold, New York, pp. 224–226, 1993.

*Primary Examiner*—Rodney B. Bovernick
*Assistant Examiner*—Yisun Song
*Attorney, Agent, or Firm*—W. C. Schubert; G. H. Lenzen, Jr.

[57] ABSTRACT

Surface-emitting distributed feedback (SEDFB) lasers having a curved grating with a shape that produces good beam quality. A preferred shape is one for which the grating curves away from the center of the gain region of the laser. The use of the curved grating of the present invention produces good beam quality from broad area SEDFB lasers with high power and high efficiency. The present invention overcomes self-induced filament formation and dynamic instabilities that limit achievable beam quality. The present invention provides for a holographic method for fabricating curved gratings for the SEDFB lasers that is consistent with laser batch processing.

7 Claims, 5 Drawing Sheets

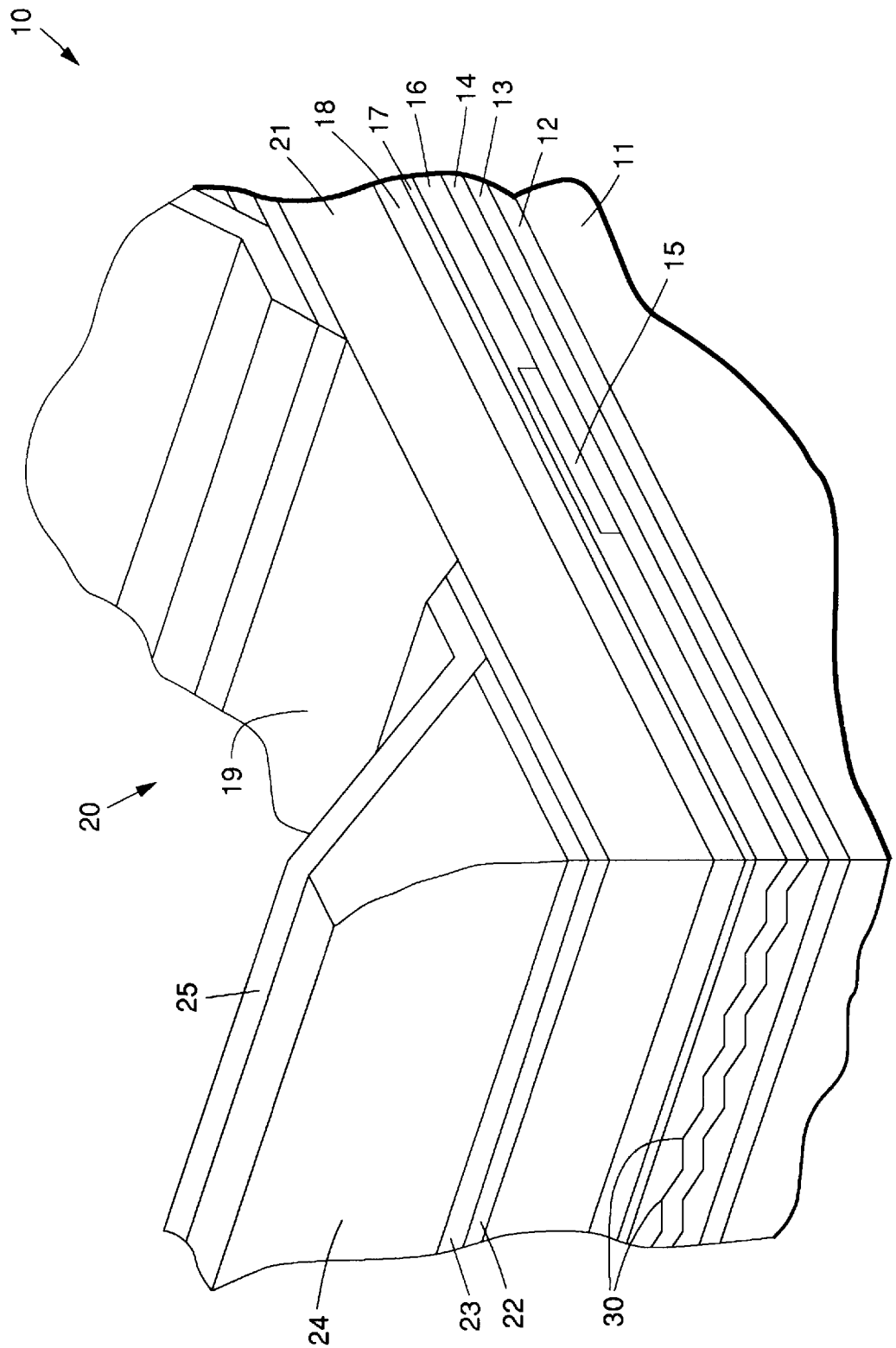

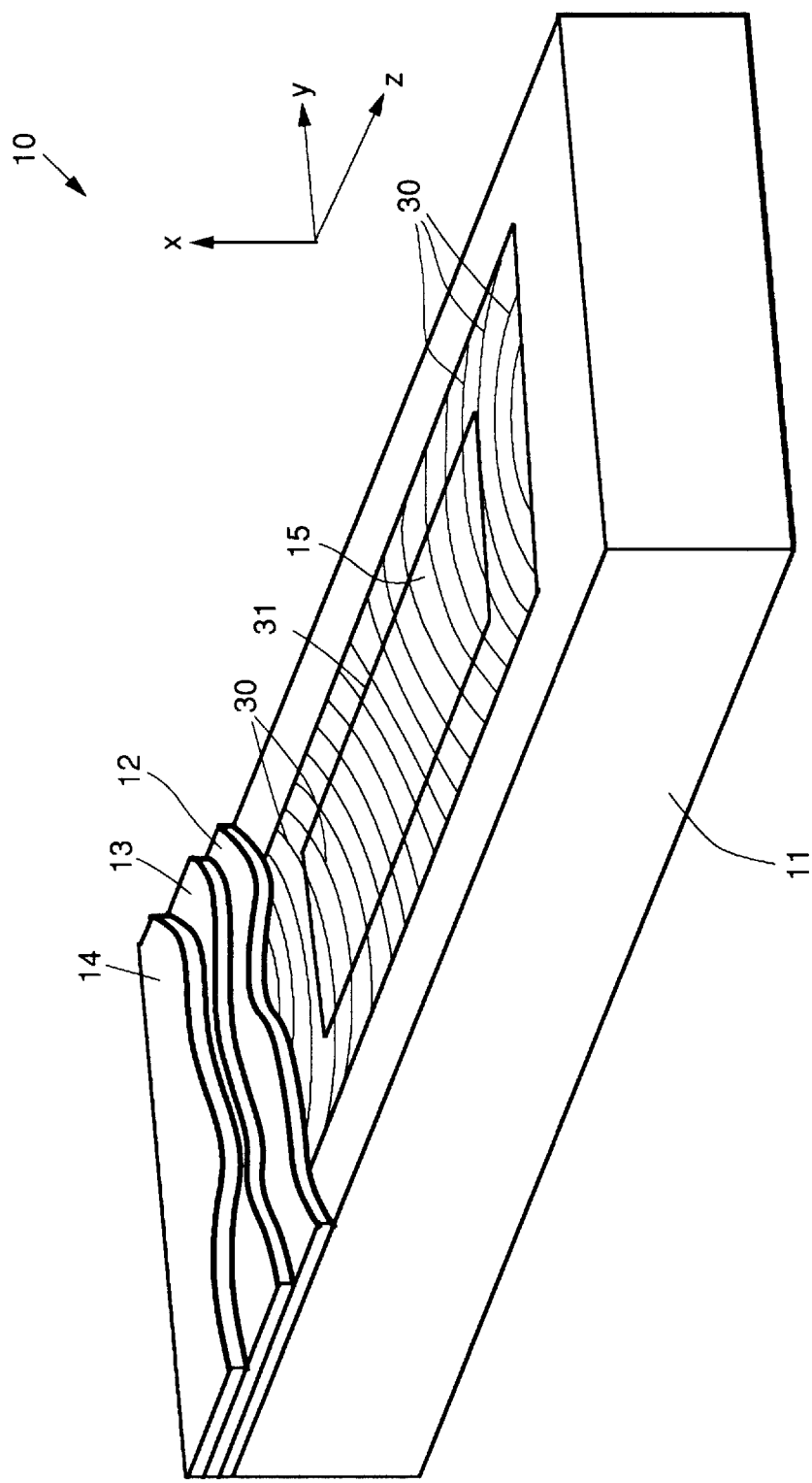

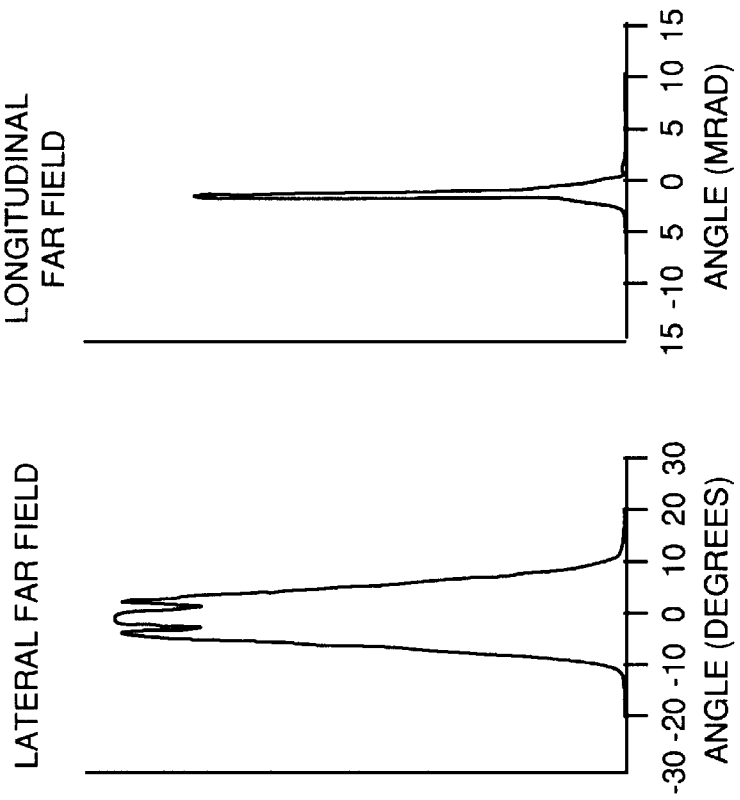
Fig. 3a LATERAL NEAR FIELD
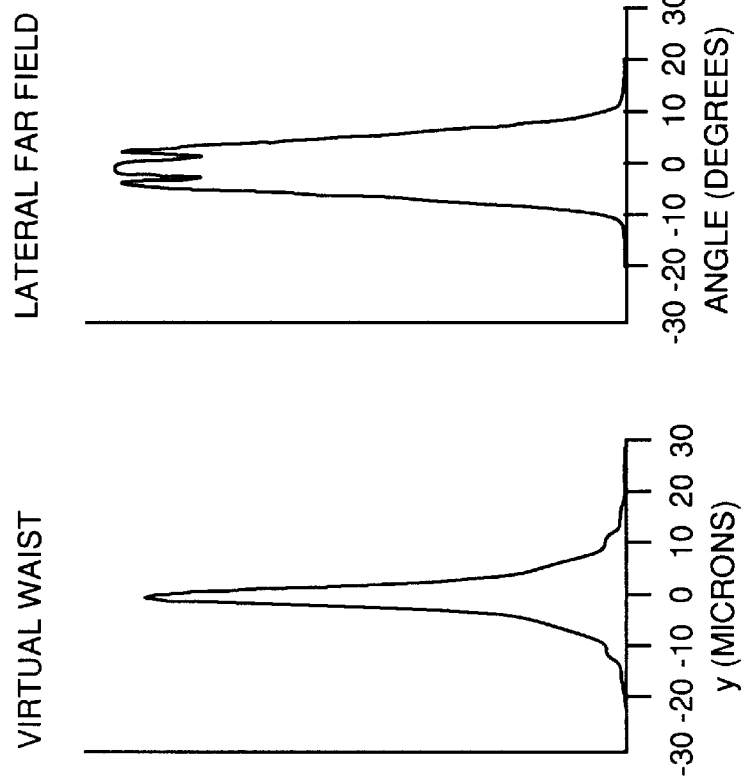
Fig. 3b VIRTUAL WAIST
Fig. 3c LATERAL FAR FIELD
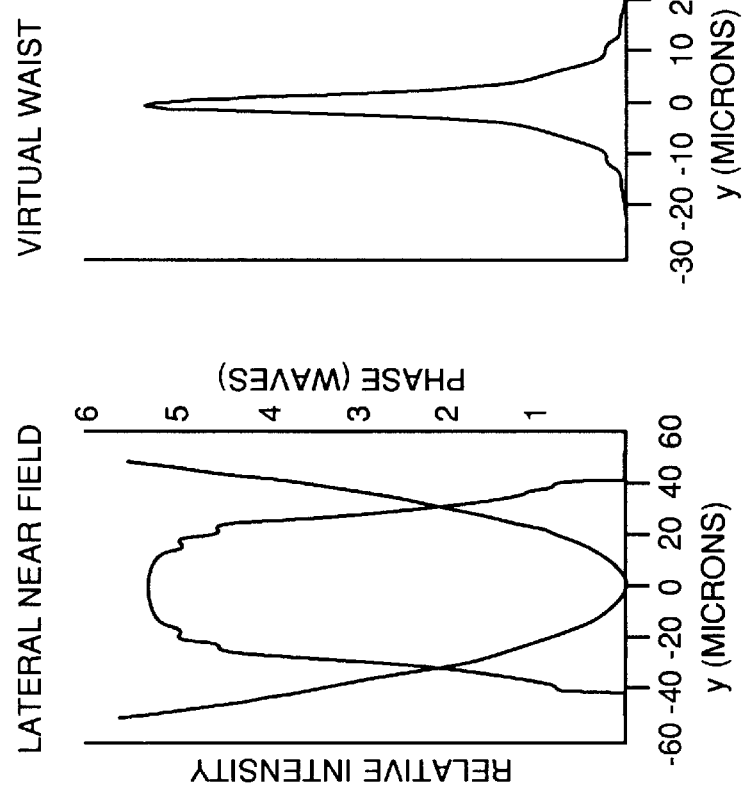
Fig. 3d LONGITUDINAL FAR FIELD

CURVED GRATING SURFACE-EMITTING DISTRIBUTED FEEDBACK LASER

This is a continuation application of Ser. No. 644,672 filed 7 May 1996 now abandoned which is a continuation application of Ser. No. 229,493 filed Apr. 19, 1994, of Steven H. Macomber now abandoned which is a continuation-in-part of Ser. No. 07/974,775, filed Nov. 25, 1992 now U.S. Pat. No. 5,345,466 which is a continuation-in-part Ser. No. 07/975,303, filed Nov. 12, 1992 now U.S. Pat. No. 5,307,183.

This invention was made with Government support under Government Contract No. F29601-C-91-0118 awarded by the Air Force. The Government has certain rights in this invention.

BACKGROUND

The present invention relates to distributed feedback lasers, and more particularly, to a surface-emitting distributed feedback (SEDFB) laser having curved gratings and a holographic method for fabricating such gratings that is consistent with batch processing of lasers.

The prior art for which the present invention is an improvement is a broad area surface-emitting distributed feedback (SEDFB) laser with chirped or straight gratings. Surface-emitting distributed feedback laser with chirped gratings are described in U.S. Pat. No. 5,241,556, issued to Macomber et al. entitled "Chirped Grating Surface-Emitting Distributed feedback Lasers", and U.S. Pat. No. 5,238,531 issued to Macomber et al. entitled "Apparatus and Method for Fabricating a Chirped Grating in a Surface-Emitting Distributed Feedback Semiconductor Laser Diode Device", both of which are assigned to the assignee of the present invention. Surface-emitting distributed feedback laser with straight gratings are described in "Surface emitting distributed feedback semiconductor laser", by S. H. Macomber et al., Appl. Phys. Lett., vol. 51, pp. 472–474, 1987,"AlGaAs surface emitting distributed feedback semiconductor laser", by S. H. Macomber et al., Proc. SPIE, vol. 893, pp. 188–194, 1988, "Two-dimensional surface emitting distributed feedback laser arrays", IEEE Photon. Lett. vol. 1, pp. 202–204, 1989, by J. S. Mott et al., "Analysis of grating surface emitting lasers", IEEE J. Quant. Electron., vol. 26, pp. 456–465 (1990), by R. J. Noll et al., "Non-linear analysis of surface emitting lasers distributed feedback lasers", IEEE J. Quant. Electron., vol. 26, pp. 2065–2074, 1990, by S. H. Macomber et al., and Recent developments in surface-emitting distributed feedback arrays", Proc. SPIE, vol. 1219, pp. 228–232, 1990, by S. H. Macomber et al.

Although the prior art has demonstrated high power, high efficiency, and good longitudinal beam quality, the lateral beam quality is generally very poor. This problem has limited the usable range in imaging laser radar systems, limited the spot size and depth of focus in applications requiring focusing, and limited the minimum core size of fiber optics into which the laser can be coupled.

The maximum achievable power from a semiconductor laser can be increased by increasing the width of the stripe. However, it has long been known that the beam quality of wide stripe semiconductor lasers is usually many times the diffraction limit. This is described in "A GaAsAl$_x$Ga$_{1-x}$As double-heterostructure planar stripe laser", H. Yonezu et al., in Japan. J. Appl. Phys., vol. 12., pp. 1585–1592, 1973, for example. This problem is caused by self-induced waveguiding that arises from a combination of spatial hole burning and index antiguiding (i.e., the index of refraction of the medium tends to decrease when the local carrier density increases) forming self-guiding filaments. This is described in "Observation of self-focusing in stripe geometry semiconductor lasers and the development of a comprehensive model of their operation", by P. A. Kirby et al., IEEE J. Quant. Electron., vol. QE-13, pp. 705–719, 1977. An initially flat wavefront propagating along a uniform wide stripe tends to break up into self-perpetuating filaments that lead to poor beam quality. This is described in "Spatial evolution of filaments in broad area laser amplifiers", Appl. Phys. Lett., by R. J. Lang et al., vol. 62, pp. 1209–1211, 1993. This problem worsens as the drive current increases, usually with a progressively more aberrated output beam. In comparison, an expanding wavefront should be much less susceptible to this problem.

Unstable resonators have been used with a variety of high power lasers. They produce a high degree of lateral mode selectivity with a mode that fills a large gain region and are relatively insensitive to intracavity index aberrations. This is described in "Unstable optical resonators", by A. E. Siegman, in Appl. Opt., vol. 13, pp. 353–367, 1974. These characteristics combined with curved (expanding) internal wavefronts that can suppress filamentation makes the unstable resonator approach well-suited to the problem of lateral mode control in broad area semiconductor lasers. Unstable resonator Fabry-Perot devices have demonstrated good lateral beam quality. This is described in "High power, nearly diffraction limited output from a semiconductor laser with an unstable resonator", by M. L. Tilton et al., IEEE J. Quant. Electron., vol. QE-27, pp. 2098–2108, 1991, and "Fabrication of unstable resonator diode lasers", by C. Largent et al., Proc. SPIE, vol. 1418, pp. 40–45, 1991. However, fabrication of curved mirrors with required surface smoothness has been problematic.

Presently copending patent application Ser. No. 07/974,775, filed Nov. 12, 1992, entitled "Curved Grating Surface-Emitting Distributed Feedback Semiconductor Laser", assigned to the assignee of the present invention, generally describes curved grating SEDFB lasers. However, this invention only relates to a constant radius grating shape as an example. It was not clear at that time what the optimum shape would be since analysis was not yet available. In the present invention, a curved grating approach is described for achieving lateral mode control in wide stripe SEDFB lasers that is analogous to an unstable resonator. Furthermore, in a second copending patent application Ser. No. 07/975,303, filed Nov. 12, 1992, entitled "Apparatus and Method of Fabricating a Curved Grating in a Surface-Emitting Distributed Feedback Semiconductor Laser Diode Device", also assigned to the assignee of the present invention, a method is described for fabricating a constant radius grating using the Talbot effect but not the more general types of curved gratings described herein. U.S. Pat. No. 5,307,183 and U.S. Pat. No. 5,345,466 are incorporated herein.

Therefore, it is an objective of the present invention to provide for a surface-emitting distributed feedback (SEDFB) laser having curved gratings that overcomes the problems associated with conventional surface-emitting distributed feedback lasers, and to provide for a holographic method for fabricating such gratings that is consistent with batch processing of lasers

SUMMARY OF THE INVENTION

In order to meet the above and other objectives, the present invention provides for a surface-emitting distributed feedback (SEDFB) laser with a curved grating having a shape that produces good beam quality. A preferred shape is one for which the grating curves away from the center of the gain region. The use of the curved grating of the present invention produces good beam quality from broad area SEDFB lasers with high power and high efficiency.

The curved grating may comprise a variable radius grating that curves away from the center of the gain region or from a central point near a center of the gain region. The curved grating typically has a grating curvature that is represented by a deformation function $L(y, z)$ whose dominant term has a form corresponding to $-zy^2$. The grating deformation function may have additional terms that improve output beam quality of the laser, that include chirp ($z^2$) and aberration correction terms ($z^3y^2$).

The present invention overcomes a fundamental problem in semiconductor lasers, namely self-induced filament formation and dynamic instabilities that limit achievable beam quality. In addition, the present invention provides for a holographic method for fabricating curved gratings that is consistent with batch processing of lasers. The method provides for fabricating a curved grating in a surface-emitting distributed feedback laser that comprises a substrate having a gain region formed adjacent a surface thereof. The method comprising the steps of providing a prism, disposing the surface of the substrate adjacent a selected surface of the prism, and irradiating the surface of the substrate with two laser beams to holographically form the curved grating in the substrate, wherein one beam is planar and the other beam has a varying phase that generates a predetermined grating distortion function.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1a shows a partial cross sectional perspective view of a portion of a curved grating surface-emitting distributed feedback laser;

FIG. 1b illustrates a perspective cutaway view of a bottom portion of the surface-emitting distributed feedback laser of FIG. 1a showing a curved grating in accordance with the principles of the present invention;

FIGS. 3a–3d illustrate graphs of numerical analysis performed on the laser of FIG. 1b;

DETAILED DESCRIPTION

Figure 2A:
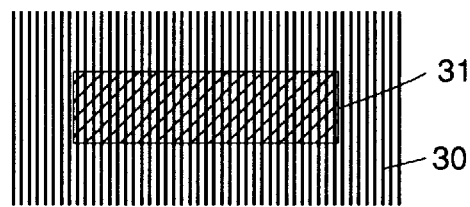
FIGS. 2a–2f illustrate different curved grating patterns that may be employed in the laser of FIG. 1b.
Figure 2B:
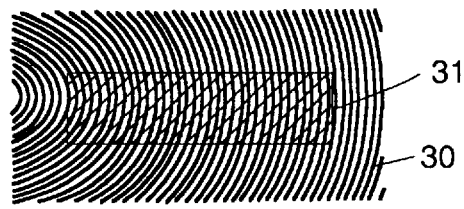
Figure 2C:
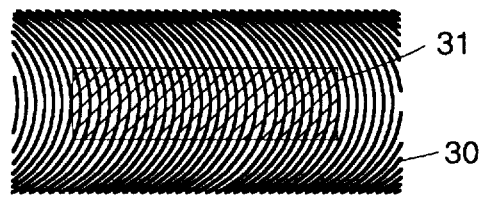
Figure 2D:
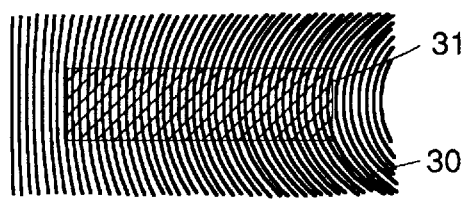

Referring to the drawing figures, FIG. 1a shows a partial cross sectional perspective view of a portion of a surface-emitting distributed feedback (SEDFB) laser 10 having a curved grating 30 in accordance with the principles of the present invention. FIG. 1b illustrates a perspective cutaway view of a bottom portion of the surface-emitting distributed feedback laser 10 of FIG. 1a showing details of the curved grating 30 in accordance with the principles of the present invention. The present invention is referred to herein as a curved grating surface-emitting distributed feedback laser 10. In general, surface-emitting distributed feedback lasers 10 are well known in the art as is evidenced by the references cited herein.

The curved grating surface-emitting distributed feedback laser 10 is comprised of an n-type gallium arsenide substrate 24 and a curved grating 30 (FIG. 1b) is formed therein subsequent to the formation of additional material layers. A zinc diffusion layer 15 is formed in the layer 16 subsequent to formation of the curved grating 30. The zinc diffusion layer 15 forms the gain region 31 or gain stripe 31 of the laser 10. The gain region 31 is shown more clearly in FIG. 1b.

As set forth in the co-pending patents, U.S. Pat. No. 5,307,183 and U.S. Pat. No. 5,345,466, the curved grating surface-emitting distributed feedback laser is fabricated on the GaAs substrate 24 in the inverse order of the disposition of the layers on the heat sink 11 as described below. On top of a heat sink 11 the plurality of material layers are disposed as follows. A layer of gold (Au) 12 is disposed on the heat sink 11. A layer of platinum (Pt) 13 is disposed on the layer of gold 12. A second layer of gold (Au) 14 is disposed on the layer of platinum 13. The second layer of gold 14 forms the curved grating 30 of the present invention, which is formed in the a p-type cladding layer 16 which is disposed over the second layer of gold 14 and the zinc diffusion layer 15. An active layer 17 is disposed over the p-type cladding layer 16. An n-type confinement layer 18 is disposed over the active layer 17. An n-type cladding layer 21 is disposed over the n-type confinement layer 18. An n-type GaAs layer 22 is disposed over the n-type cladding layer 21. A stop etch layer 23 is disposed over the n-type GaAs layer 22 which is used to form an output window 19. An n-type GaAs layer 24 is disposed over the stop etch layer 23. Finally, a gold-germanium-nickel (Au—Ge—Ni) layer 25 is disposed over the n-type GaAs layer 24. The output window 19 is disposed at the bottom of an etched well 20.

FIG. 1b illustrates a perspective cutaway inverted view of a bottom portion of the surface-emitting distributed feedback laser 10 of FIG. 1a showing the curved grating 30 in accordance with the principles of the present invention. The bottom-most layers illustrated in FIG. 1a are shown that include the gold, platinum and second gold layers 12, 13, 14. The other layers, 16, 17, 18, 21, 22 and 23 are not shown separately from the substrate 24 in FIG. 1a. The gain region 31 or gain stripe 31 is formed by the zinc diffusion layer 15. The design and construction of surface-emitting distributed feedback lasers is well-known in the art and will not be further described herein except for the improvements provided by the present invention.

The basic idea behind the present invention is to use a curved grating 30 having particular shapes in a broad area SEDFB laser 10 with an otherwise standard type of design, such as are described in the above-cited articles or patents. As shown by the examples in FIGS. 2a–2f, there are many possible shapes for the curved grating 30 that may be used. FIGS. 2a–2f illustrate different curved grating patterns that may be employed in the laser 10 of FIG. 1. All these grating designs have a nearly constant grating periodicity that satisfy the grating resonance condition:

$$\lambda = \bar{n}\Lambda \qquad (1)$$

where $\lambda$ is vacuum wavelength, $\bar{n}$ is an effective index of a waveguide, and $\Lambda$ is grating periodicity.

Figure 2E:
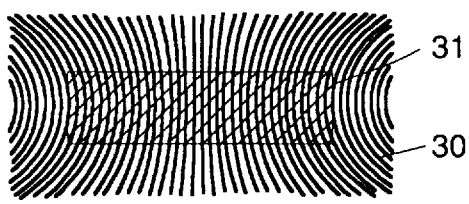
Figure 2F:
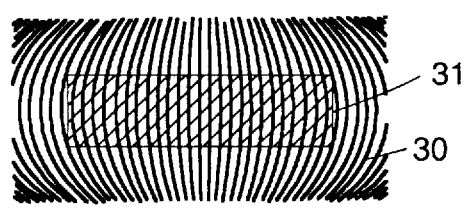

Of all the grating shapes illustrated in FIGS. 2a–2f, a numerical model of the laser 10 has shown that a variable radius grating 30 that curves away from the center of the lasers stripe 31, as is shown in FIG. 2e, has the best lateral mode stability and beam quality. This shape is analogous to an unstable resonator in a Fabry-Perot diode laser.

Curved grating shapes may be described mathematically by a function L(y,z) that deforms a linear grating into the curved grating 30. If y and z are, respectively, the lateral and longitudinal coordinates of an undeformed grating then a transformation to a new coordinate system (y, z)→(y', z')

$$z'=z+L(Y, Z) \qquad (2)$$

$$y'=y \qquad (3)$$

is such that deformed grating grooves lie on lines of constant z'. The grating shape shown in FIG. 2(e) is described by a dominant term $$L(y, z) \alpha\ zy^2 \qquad (4)$$

where (y, z)=(0, 0) is at (or near) the center of the gain stripe 31.

Results from the numerical simulation are presented below. Numerical simulation results were obtained for several types of curved grating SEDFB lasers 10. Of all the curved grating designs that were modeled, the design in FIG. 2(e) produced the most stable solutions at high antiguiding. A generalization of equation (4) that includes a $z^2$ term for grating chirp as well as a $z^3y^2$ term that was found to correct for astigmatism is given by:

$$L(y, z) \alpha\ c_{20}z^2 + c_{12}zy^2 + c_{32}\ z^3y^2. \qquad (5)$$

In the particular case that was modeled, the gain stripe 31 was 1200 μm long by 50 μm wide where the grating function given in (5) had a coefficient such that grating phase deviation at the corners corners of the gain stripe 31 from the three terms was

| Term | Magnitude |
|---|---|
| $c_{20}z^2$ | 0.25 waves |
| $c_{12}zy^2$ | −1 waves |
| $c_{32}z^3y^2$ | 0.1 waves. |

The magnitude of the chirp term was typical of that used in experiments with non-curved SEDFB lasers that produce a single-lobed longitudinal far field.

The optimum value of these terms vary with the dimensions of the gain stripe 31, but are of the same order of magnitude as the example case above. Additional higher order terms may be used to reduce aberrations in the output beam of the laser 10.

Thus, in a preferred embodiment of the curved grating surface-emitting distributed feedback laser 10, the curved grating 30 is a variable radius grating 30 that curves away from the center of the laser stripe 31 or gain region 31. Use of such a variable radius grating 30 achieves lateral mode control in a wide stripe SEDFB laser 10 that is analogous to an unstable resonator.

FIGS. 3a–3d illustrate graphs of numerical analysis performed on the preferred embodiment of the laser 10 of FIG. 1. A cross-section of the center of the near field is shown in FIG. 3a. The intensity is relatively smooth while the phase has an overall quadratic lateral phase profile that corresponds to approximately 5 μm virtual waist located approximately 0.3 mm behind the device near field plane as shown in FIG. 3b. The lateral far field for this case, shown in FIG. 3c, is consistent with the divergence from a nearly diffraction limited source at the virtual waist. The longitudinal field in FIG. 3d shows a profile that is typical of past chirp lasers.

These results stand out from all other types of SEDFB lasers that were tested using the same computer program.

Linear arrays, offset arrays, tilted arrays, Talbot spatial filter and broad stripes were simulated and found to be numerically unstable at even low levels of antiguiding. This results parallels the results from comprehensive dynamical models of Fabry-Perot diode lasers for which all but narrow stripe and unstable resonator designs were dynamically unstable, such as are described in "Spatiotemporal chaos in broad area semiconductor lasers", by H. Adachihara et al., J. Opt. Soc. Am., vol. B10, pp. 658–665, 1993, and in U.S. Pat. No. 4,803,696 entitled "Laser with Grating Feedback Unstable Resonator", assigned to the assignee of the present invention.

For comparative purposes, U.S. Pat. No. 4,803,696 cited above discloses that a partially reflecting facet, in addition to a grating, participates in establishing the lasing mode. The present invention does not use any reflectors but instead relies completely on the grating 16. Four of the five embodiments disclosed in U.S. Pat. No. 4,803,696 use separate gain and grating regions, whereas the present invention provides for for colocation of the gain region 31 and grating 20. The one embodiment in U.S. Pat. No. 4,803,696 that does colocate the gain region and grating has a different grating shape than the present invention.

A method of fabricating a curved grating 30 for the curved grating surface-emitting distributed feedback laser 10 in accordance with the principles of the present invention will now be described. To be cost-effective, fabrication of the laser 10 must be compatible with wafer level batch processing. The grating pattern must be repeated over the gain stripe 31 of each laser 10 on a wafer. The present method uses a holographic grating fabrication technique as is described below, although non-holographic techniques may also be employed, but are not considered to be as practical.

Figure 4:
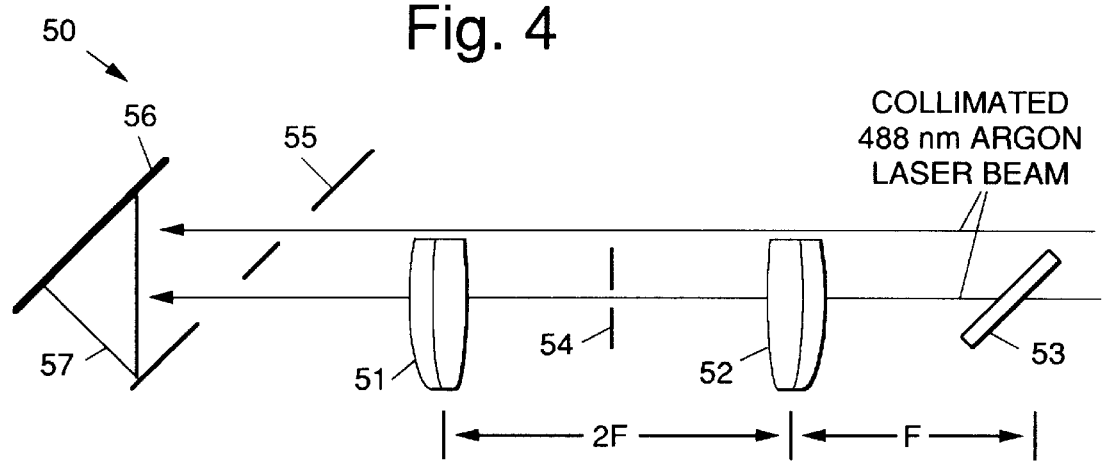
FIG. 4 illustrates grating exposure apparatus employed in making the curved grating in the laser of FIG. 1b.

A prism contact technique currently used by the assignee of the present invention may be used with the addition of two lenses 51, 52 and a phase plate 53 as shown in FIG. 4. The prism contact technique is described in detail in U.S. Pat. No. 5,241,556 cited above. FIG. 4 illustrates grating exposure apparatus 50 employed in making the curved grating 30 in the laser 10 of FIG. 1 in conjunction with the prism contact technique. The grating exposure apparatus 50 includes a phase plate 53, two lenses 51, 52, a spatial filter 54 disposed between the lenses 51, 52, a baffle 55, a prism 57 and a wafer 56 (substrate 11) masked with photoresist arranged as shown in FIG. 4. Two-beam interference at a surface of the wafer 56 is employed where one beam is planar and the second beam has a varying phase Φ(y, z) that generates a grating distortion function given by $$L(y, z)=\Phi(y, z)/K_0 \qquad (6)$$

where $K_0=2\pi/\Lambda$ is the grating vector. A glass (or fused silica) phase plate 53 has a height profile h(y, z) that produces a phase profile given by $$h(y, z) = \frac{\lambda}{n-1} \cdot \Phi(y, z). \qquad (7)$$

The phase plate 53 may be comprised of any optically transparent material in which the surface height pattern is stepped and repeated over a large area such that it aligns with a stripe mask used to fabricate the lasers 10. A variety of conventional methods are available for fabricating such phase plates 53.

Figure 5A:
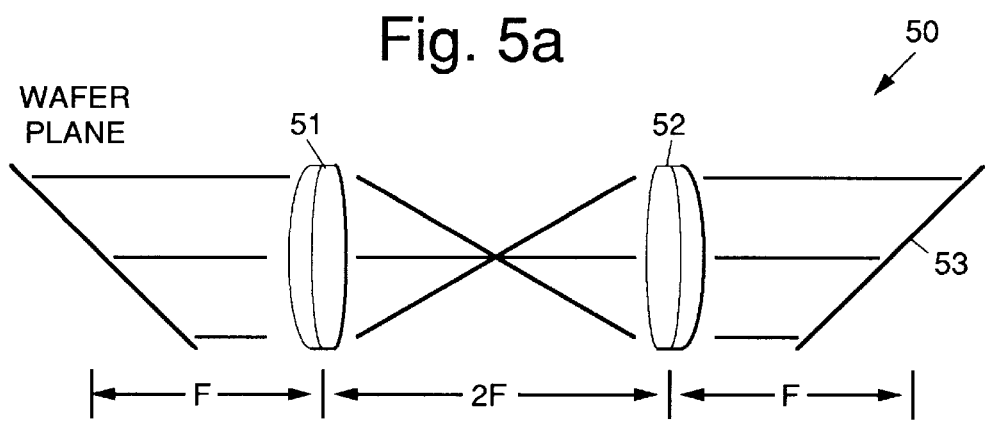
FIGS. 5a and 5b illustrate relay optical systems for producing the curved grating in the laser of FIG. 1b.
Figure 5B:
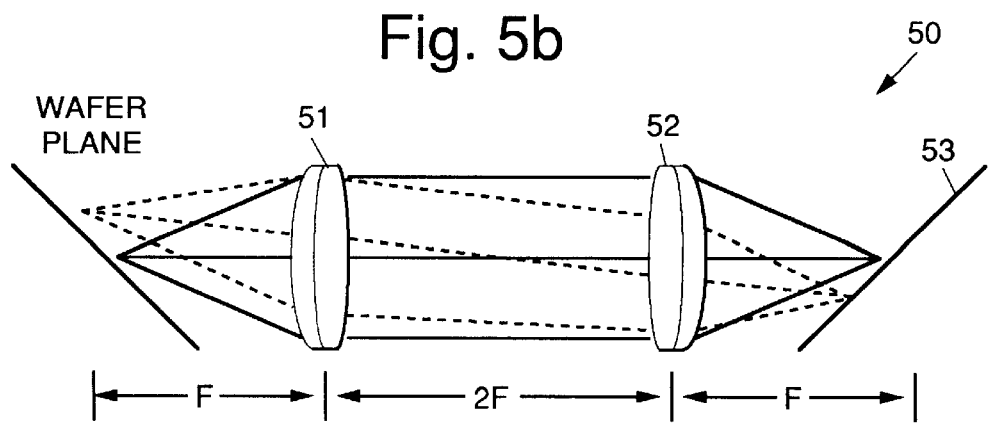

The behavior of the imaging optics employed in the grating exposure apparatus 50 is shown in FIGS. 5a and 5b. Referring to FIG. 5a, the two lenses 51, 52, each of focal length F, are spaced a distance 2F apart such that a plane wave images to a plane wave and a point images to a point.

The image and object planes are tilted as shown since the wafer exposure surface, or wafer plane, unfolded from the prism 57, is also tilted. The opposing tilts ensure that, to first order, the image and object distances satisfy the lens equation. The lenses 51, 52 have one edge cut down or truncated to prevent shadowing of a plane wave input beam. The phase plate tilt angle is nominally 34 degrees, depending on the exact index of refraction of the prism 57 and the prism angle. The coarse spatial filter 54 centrally located between the lenses 51, 52 removes unwanted high spatial frequencies (e.g., spatial period less than 10 $\mu$m) that may arise from a phase plate 53 made using binary optics or imperfections in an analog plate. The same principle of relaying the image of the phase plate 53 may be adapted to any other two-beam holographic system such as those that use ultraviolet lasers and do not necessarily use a prism. The same principle of relaying the image of a phase plate 53 may be adapted to any other two-beam holographic system such as those that use ultraviolet lasers and do not necessarily use a prism. Moreover, the focal lengths of the lenses 51, 52 do not necessarily have to be equal as long as they are confocal. Also, the phase plate 53 may be used in reflection instead of in transmission. The phase pattern may also be impressed in the form of a gradient index, for example, as fabricated by masking and ion exchange in glass.

There are numerous commercial and military applications for the present laser 10. Examples of identified commercial applications include laser gingivectomy, medical laser surgery, photo-dynamic therapy, materials micro-joining, ignition of jet fuel, pump sources for solid state lasers, color laser printers, soldering systems, and frequency-doubled blue lasers. Examples of military applications include laser initiated ordinance for ejection seats, jet engine ignition, wide field imaging laser radar for ground search, narrow field of view forward-looking imaging laser radar systems for missile guidance, free space optical communications systems, illuminators for night visions systems, and medical hand-held lasers for tracheotomy or wound cauterization.

Thus there has been described a new and improved surface-emitting distributed feedback laser having curved gratings and a holographic method for fabricating such gratings that is consistent with batch processing of lasers. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. In a surface emitting distributed feedback laser having a p-type cladding layer with a gain region and a curved grating the improvement wherein the curved grating formed in the gain region comprises a variable radius grating that curves away from a central point near a center of the gain region.

2. The laser of claim 1 wherein the curved grating has a grating curvature that is represented by a deformation function L(y, z) whose dominant term has a form corresponding to $(-zy^2)$, wherein z is a dimension along a longitudinal axis of the gain medium and y is a dimension along a transverse axis of the gain medium, and wherein the origin of y and z is located near the center of the gain region.

3. The laser of claim 2 wherein the grating deformation function has additional terms that improve output beam quality of the laser, which terms include chirp ($z^2$) and aberration correction terms ($z^3y^2$).

4. In a surface emitting distributed feedback laser having a p-type cladding layer with a gain region and a curved grating the improvement wherein the curved grating formed in the gain region comprises a second order, variable radius curved grating that curves away from a center of the gain region.

5. The laser of claim 4 wherein the curved grating comprises a variable radius grating that curves from a central point near a center of the gain region.

6. The laser of claim 4 wherein the curved grating has a grating curvature that is represented by a deformation function L(y, z) whose dominant term has a form corresponding to $(-zy^2)$, wherein z is a dimension along a longitudinal axis of the gain medium and y is a dimension along a transverse axis of the gain medium, and wherein the origin of y and z is located near the center of the gain region.

7. The laser of claim 6 wherein the grating deformation function has additional terms that improve output beam quality of the laser, which terms include chirp ($z^2$) and aberration correction terms ($z^3y^2$).

* * * * *